United States Patent
Pramod et al.

(10) Patent No.: US 9,985,564 B2
(45) Date of Patent: May 29, 2018

(54) FLUX ESTIMATION FOR FAULT TOLERANT CONTROL OF PMSM MACHINES FOR EPS

(71) Applicant: Steering Solutions IP Holding Corporation, Saginaw, MI (US)

(72) Inventors: Prerit Pramod, Saginaw, MI (US); Rakesh Mitra, Saginaw, MI (US)

(73) Assignee: STEERING SOLUTIONS IP HOLDING CORPORATION, Saginaw, MI (US)

( * ) Notice: Subject to any disclaimer, the term of this patent is extended or adjusted under 35 U.S.C. 154(b) by 93 days.

(21) Appl. No.: 15/054,554

(22) Filed: Feb. 26, 2016

(65) Prior Publication Data
US 2017/0250641 A1 Aug. 31, 2017

(51) Int. Cl.
| | | |
|---|---|---|
| G01P 3/48 | (2006.01) | |
| H02P 21/14 | (2016.01) | |
| G01R 33/04 | (2006.01) | |
| G01R 33/038 | (2006.01) | |
| H02P 21/18 | (2016.01) | |
| G01P 3/44 | (2006.01) | |

(52) U.S. Cl.
CPC ........ H02P 21/141 (2013.01); G01R 33/0385 (2013.01); G01R 33/04 (2013.01); H02P 21/18 (2016.02); *G01P 3/44* (2013.01)

(58) Field of Classification Search
CPC ...... H01F 7/0273; H02K 35/00; H02K 35/02; H02K 2203/00; H02K 7/1876; H02K 7/12; H02K 11/215; H02K 11/22; H02K 11/33; H02K 16/04; H02K 19/103; H02K 1/246; H02K 1/276; H02K 21/14; H02K 29/00; H02K 29/10; H02K 29/12; H02K 31/02; H02K 3/28; H02K 5/12; H02K 7/006; H02K 7/14; H02K 7/1823; H02M 7/064; H02M 7/066; H02M 3/158; G01R 33/0286; G01R 33/1261; G01R 25/00; G01C 19/08

See application file for complete search history.

(56) References Cited

U.S. PATENT DOCUMENTS

| | | | | |
|---|---|---|---|---|
| 6,841,969 | B1 * | 1/2005 | Schulz | H02P 21/13 318/610 |
| 9,682,336 | B2 * | 6/2017 | Lucas | B01D 50/002 |
| 2009/0218965 | A1 * | 9/2009 | Williams | B62D 5/046 318/265 |
| 2015/0268283 | A1 * | 9/2015 | Mariethoz | G01R 25/00 702/66 |

* cited by examiner

*Primary Examiner* — Vinh Nguyen
(74) *Attorney, Agent, or Firm* — Cantor Colburn LLP

(57) ABSTRACT

A system for estimating flux linkage in an electric motor includes a flux estimation module that generates estimated flux linkages based on a back electromagnetic force and estimated velocity of the electric motor, the flux linkages having an alpha flux linkage component and a beta flux linkage component, and a velocity estimation module that generates an estimated motor velocity based on the back electromagnetic force and the estimated flux linkages.

20 Claims, 7 Drawing Sheets

FLUX ESTIMATION FOR FAULT TOLERANT CONTROL OF PMSM MACHINES FOR EPS

BACKGROUND OF THE INVENTION

Electric Power Steering (EPS) systems utilize an electric motor, typically a Permanent Magnet Synchronous Machine (PMSM), to provide steering assist to the driver. PMSMs are controlled using a well-known technique called Field Oriented Control (FOC), which allows sinusoidal three phase motor voltage and current signals to be transformed into equivalent signals in a synchronously rotating reference frame, commonly referred to as the DQ reference frame, where the motor voltages and currents become DC quantities. The reference frame transformation requires information of the absolute position of the rotor of the machine, which is usually obtained by using a physical position sensor. Sensorless Control (SC) refers to the class of control schemes in which the motor is controlled without a physical position sensor. SC methods can be classified into two broad categories, namely the Direct Torque Control (DTC) and Field Oriented Control (FOC) methods. While DTC does not require any direct knowledge of the position, FOC relies on direct knowledge of position. In contrast with their sensor based counterpart, SC-FOC schemes employ observers or estimators to obtain the position of the machine, however, the overall control architecture remains identical to a sensor based FOC scheme. EPS systems typically employ a sensor based FOC system for motor control, but SC provides an alternative to provide Fault Tolerant Control (FTC) in order to avoid Loss of Assist (LoA) when the position sensor fails.

Most SC algorithms require estimation of the stator flux linkages for the control implementation. For DTC systems, the flux estimation is used for torque estimation, which is then used along with the flux estimates to generate gate signals for the Voltage Source Inverter (VSI) directly. FOC systems require flux estimates in order to estimate the machine velocity and position. For high performance applications such as EPS, it is critical to accurately estimate the stator flux, because errors in these quantities result in direct performance degradation of the overall drive system.

SUMMARY OF THE INVENTION

In some embodiments, a system for estimating flux linkage in an electric motor includes a flux estimation module that generates estimated flux linkages based on a back electromagnetic force and estimated velocity of the electric motor, the flux linkages having an alpha flux linkage component and a beta flux linkage component; and a velocity estimation module that generates an estimated motor velocity based on the back electromagnetic force and the estimated flux linkages.

In some embodiments, a method for estimating flux linkage in an electric motor comprises generating estimated flux linkages based on a back electromagnetic force and estimated velocity of the electric motor, the flux linkages having an alpha flux linkage component and a beta flux linkage component, and generating an estimated motor velocity based on the back electromagnetic force and the estimated flux linkages.

These and other advantages and features will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
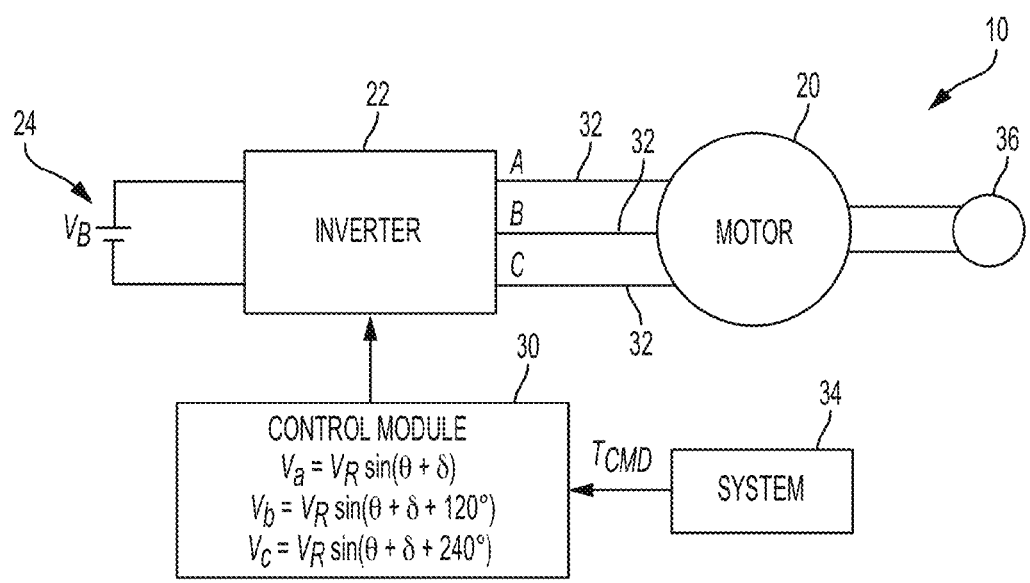
FIG. 1 is an exemplary schematic illustration of a motor control system in accordance with some embodiments.

Referring now to the Figures, where the invention will be described with reference to specific embodiments, without limiting same, FIG. 1 illustrates a motor control system 10 in accordance with one aspect of the invention. In the exemplary embodiments as shown, the motor control system 10 includes a motor 20, an inverter 22, a voltage supply 24, and a control module 30 (also referred to as a controller). The voltage supply 24 supplies a supply voltage $V_B$ to the motor 20. In some embodiments, the voltage supply 24 is a 12-volt battery. However, it is to be understood that other types of voltage supplies may be used as well. The inverter 22 is connected to the motor 20 by a plurality of connections 32 (e.g., three connectors) that are labeled as 'A', 'B' and 'C'. In some embodiments, the motor 20 is a poly-phase PMSM. In this example, the motor 20 is a three-phase PMSM. The control module 30 is connected to the motor 20 through the inverter 22. The control module 30 receives a motor torque command $T_{CMD}$ from a system 34 such as, for example, a steering control system. The control module 30 includes control logic for sending motor voltage commands to the motor 20 through the inverter 22.

The motor 20 is a plant that may be represented by a mathematical model in the DQ reference frame. The following equations may represent the mathematical model, $$\psi_d = L_d I_d - \lambda_m$$

$$\psi_q = L_q I_q$$

$$T_e = \psi_q I_d - \psi_d I_q$$

$$V_d = I_d R + \dot{\lambda}_d + \omega_e \lambda_q$$

$$V_q = I_q R + \dot{\lambda}_q - \omega_e \lambda_d$$

In the above equations, $\lambda_d$ and $\lambda_q$ are stator flux linkages, $I_d$ and $I_q$ are currents, $V_d$ and $V_q$ are voltages and $T_e$ is the electromagnetic torque. The machine parameters are the inductances $L_d$ and $L_q$ (which vary with the motor currents), resistance R (which varies with temperature) and magnet flux $\lambda_m$ (which varies with both motor currents and temperature).

For a non-salient pole machine, such as a Surface Permanent Magnet (SPM) machine, the two machine inductances are equal and are referred to as the synchronous inductance $L_s$. The synchronous inductance $L_s$ is equal to $L_d$ and $L_q$, i.e., $L_d = L_q = L_s$.

The plant model in the stationary or αβ reference frame for an SPM machine is as shown below, $$\psi_\alpha = L_s I_\alpha - \lambda_m \cos\theta$$

$$\psi_\beta = L_s I_\beta - \lambda_m \sin\theta$$

$$T_e = \psi_\beta I_\alpha - \psi_\alpha I_\beta$$

$$V_\alpha = \dot\psi_\alpha + R I_\alpha = E_\alpha + R I_\alpha$$

$$V_\beta = \dot\psi_\beta + R I_\beta = E_\beta + R I_\beta$$

As referred to above, $\lambda_\alpha$ and $\lambda_\beta$ are stator flux linkages, $I_\alpha$ and $I_\beta$ are currents and $V_\alpha$ and $V_\beta$ are voltages.

The two reference frames are related by the Park transformation shown below, $$\begin{bmatrix} \alpha \\ \beta \end{bmatrix} = \begin{bmatrix} \cos\theta & \sin\theta \\ \sin\theta & -\cos\theta \end{bmatrix} \begin{bmatrix} d \\ q \end{bmatrix}$$

Figure 2:
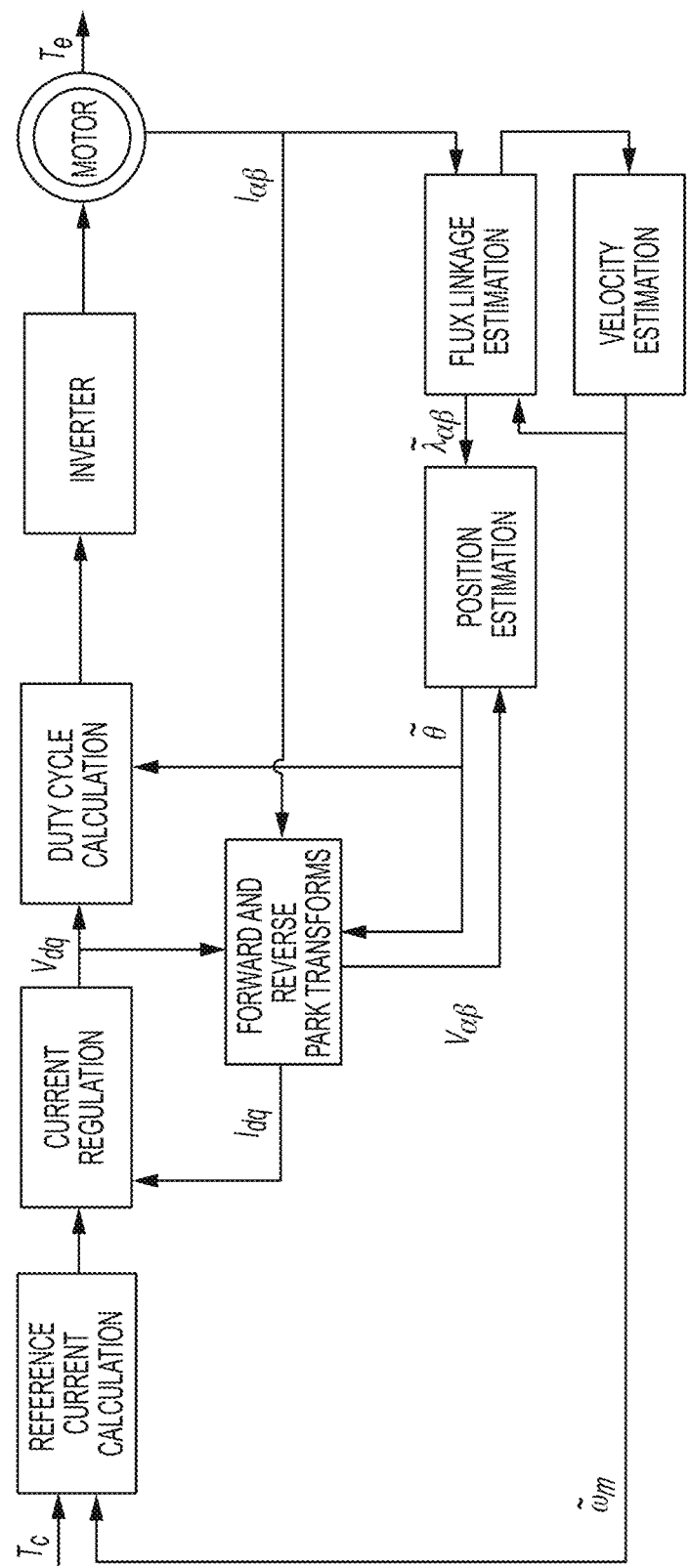
FIG. 2 is an exemplary block diagram of a SC-FOC system in accordance with some embodiments.

FIG. 2 is an exemplary block diagram of a SC-FOC system. The control module described in further detail below can be implemented in a SC-FOC system. As shown in the figure, the position is estimated using the flux and velocity estimates. The measured phase currents are transformed into the DQ reference frame using the park transform and a current regulator is used to track the current commands. The voltages computed by current regulator are used along with the estimated position to determine the duty cycles to be applied to the inverter.

Figure 3:
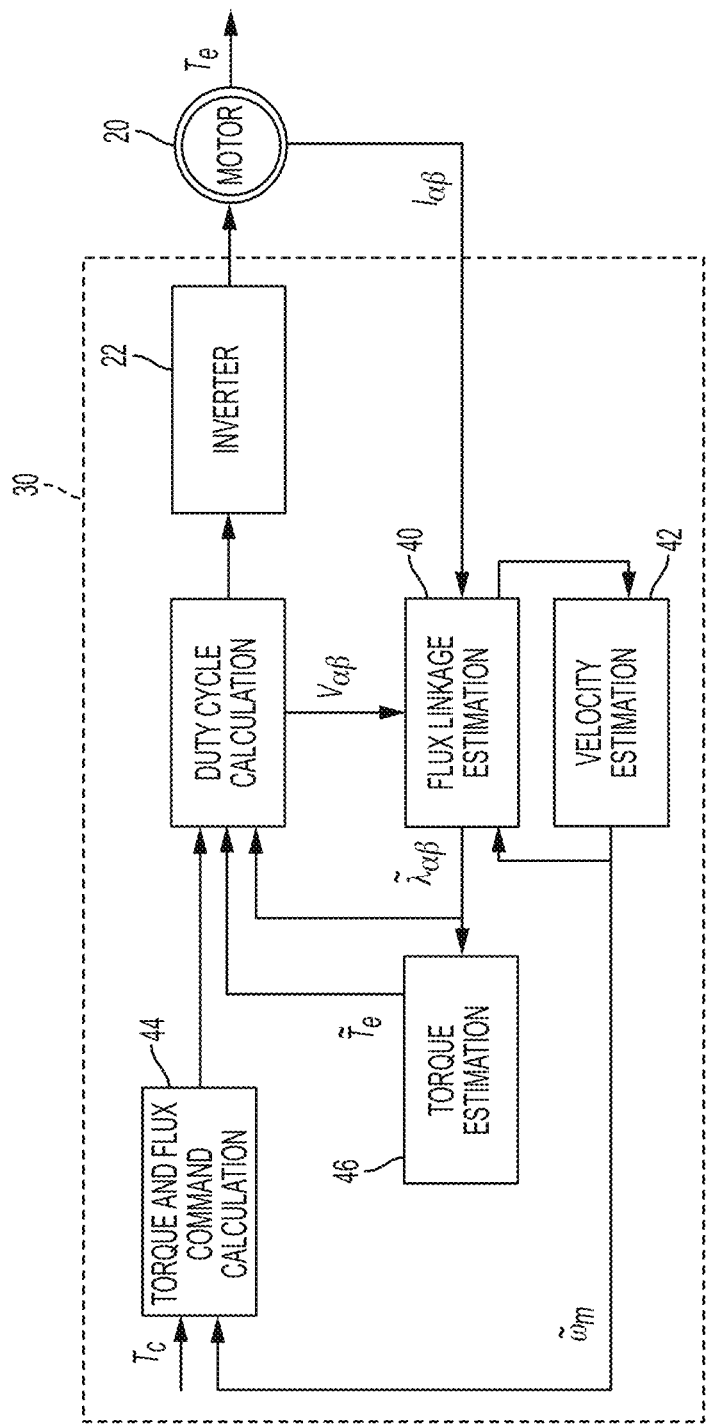
FIG. 3 is an exemplary block diagram of selected components of the control module in accordance with some embodiments.

FIG. 3 is an exemplary block diagram of a portion of the control module 30 in accordance with some embodiments of the invention. As shown, the control module 30 includes several sub-modules including but not limited to a flux estimation module 40 and a velocity estimation module 42. As shown the control module 30 also includes a torque and flux command calculation module 44 and a torque estimation module 46.

The flux estimation module 40 and the velocity estimation module 42 provide accurate and robust flux and speed estimation. These modules can be implemented digitally as described herein, and these modules may be tuned for optimization of transient and steady-state responses. Further, a closed-loop position observer may also include at least the flux estimation module 40. The closed-loop position observer may also generate a separate velocity estimate. The various modules and observers may be applied in both DTC and FOC based SC schemes. The proposed can be applied in non-salient pole machines ranging from very low to very high speeds.

EPS systems utilize a motor 20 operatively connected to an inverter 22. The motor 20 may be a PMSM to provide steering assist to the driver. A control technique is FOC, which allows the sinusoidal three phase motor voltage and current signals to be transformed into equivalent signals in a synchronously rotating reference frame, commonly referred to as the DQ reference frame, where the motor voltages and currents become DC quantities. The reference frame transformation requires information of the absolute position of the machine, which is usually obtained by using a physical position sensor.

SC refers to the class of control schemes in which the motor is controlled without a physical position sensor. SC methods can be classified into two broad categories, namely the DTC and FOC methods. While the former does not require any direct knowledge of the position, the latter relies on direct knowledge of position. In contrast with its sensor based counterpart, SC-FOC schemes employ observers or estimators to obtain the position of the machine, however, the overall control architecture remains identical to a sensor based FOC scheme. EPS systems typically employ a sensor based FOC system for motor control. However, SC provides an attractive alternative to provide FTC in order to avoid LoA when the position sensor fails.

Most SC algorithms, whether they belong to the FOC or DTC class, require estimation of the stator flux linkages for the control implementation. For DTC systems, the flux estimation is used for torque estimation, which is then used along with the flux estimates to generate gate signals for the VSI directly. A general SC-DTC architecture employed for PMSMs is shown in FIG. 3.

Based on the above equations that relate to the motor 20, the flux linkages may be estimated from the back electromotive force (BEMF), which is calculated from the terminal or commanded voltages and measured currents of the machine using the following equations, $$\psi_{\alpha\beta} = \int_{t_0}^{t} E_{\alpha\beta} dt = \int_{t_0}^{t}(V_{\alpha\beta} - R I_{\alpha\beta})dt$$

The commanded voltages and measured currents are represented by $V_{\alpha\beta}$ and $I_{\alpha\beta}$, both of which have an alpha and a beta component. Thus, $E_{\alpha\beta}$ includes the respective $V_{\alpha\beta}$ (commanded voltage) and $I_{\alpha\beta}$ (measured currents), each with alpha and beta components. It should be noted that if a measurement of the actual voltages applied to the motor is available, it is preferable to use those instead of commanded voltages.

In the s-domain, the integration may be written as, $$\psi_{\alpha\beta} = \frac{E_{\alpha\beta}}{s} = \frac{V_{\alpha\beta} - R I_{\alpha\beta}}{s}$$

The flux estimation module 40 estimates flux linkages based on the BEMF signals of a power steering motor and an estimated velocity of the power steering motor. The flux estimation module 40 estimates flux linkages based on the motor currents, voltages, and an estimated velocity of the power steering motor.

Figure 4:
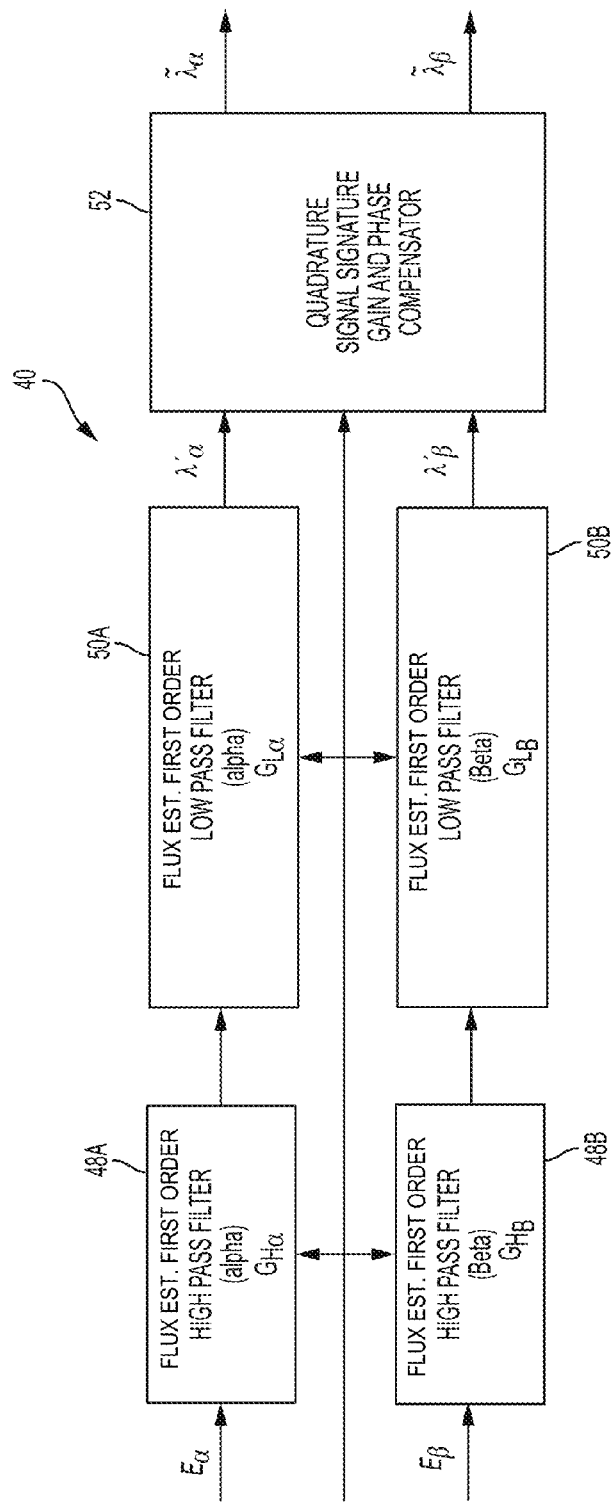
FIG. 4 is flow diagram illustrating a flux estimation module in accordance with some embodiments.

As shown in FIG. 4, the flux estimation module 40 may include a flux estimation high pass filter module (alpha) 48A and a flux estimation high pass filter module (beta) 48B. The flux estimation module 40 may further include a flux estimation low pass filter module (alpha) 50A and a flux estimation low pass filter module (alpha) 50B. The flux estimation high pass filter module (alpha) 48A and the flux estimation low pass filter module (alpha) 50A may filter the alpha component of the BEMF, where the flux estimation high pass filter module (beta) 48B and the flux estimation low pass filter module (beta) 50B may filter the beta component of the BEMF. Although FIG. 4 shows the low pass filter module 50 processing the output of the high pass filter module 48, this configuration can be reversed. Thus, the flux estimation high pass filter modules 48A, 48B can process the respective outputs of the flux estimation low pass filter modules 50A, 50B. The flux estimation high pass filter modules 48A, 48B and the flux estimation low pass filter modules 50A, 50B may be programmable and therefore operate as functions of the estimated motor velocity. Specifically, the flux estimation high pass filter modules 48A, 48B and the flux estimation low pass filter modules 50A, 50B may be individually programmable as a function of the estimated motor velocity. The respective transfer functions $G_H(s)$ and $G_L(s)$ of the flux estimation high pass filter modules 48A, 48B and the flux estimation low pass filter modules 50A, 50B respectively may be written as follows, $$G_H(s) = \frac{s}{s + k_H|\tilde{\omega}_e|}$$

$$G_L(s) = \frac{1}{s^2 + 2\zeta k_L|\tilde{\omega}_e|s + k_L^2|\tilde{\omega}_e|^2}$$

where $\tilde{\omega}_e$ is the estimated motor electrical velocity or synchronous frequency. The flux estimation module 40 applies for a non-standstill condition, and thus the velocity input must be limited to an appropriate lower limit.

The flux linkage estimation module 40 of FIG. 4 also includes a quadrature signal signature compensator module 52 that receives the respective outputs of the flux estimation low pass filter modules 50A, 50B in one embodiment. If the filter modules are tuned such that the gain and phase of the composite structure is not substantially identical as that of an integrator, the quadrature signal signature compensator 52 module modulates the filtered output, to ensure the output of the flux estimation module 40 mimics characteristics of a pure integrator in steady-state. Thus, the configuration described in FIG. 4 can be a decoupled cascaded structure, where both signal paths are decoupled, and also as a complimentary structure, where both signals are used to correct each other.

Figure 5:
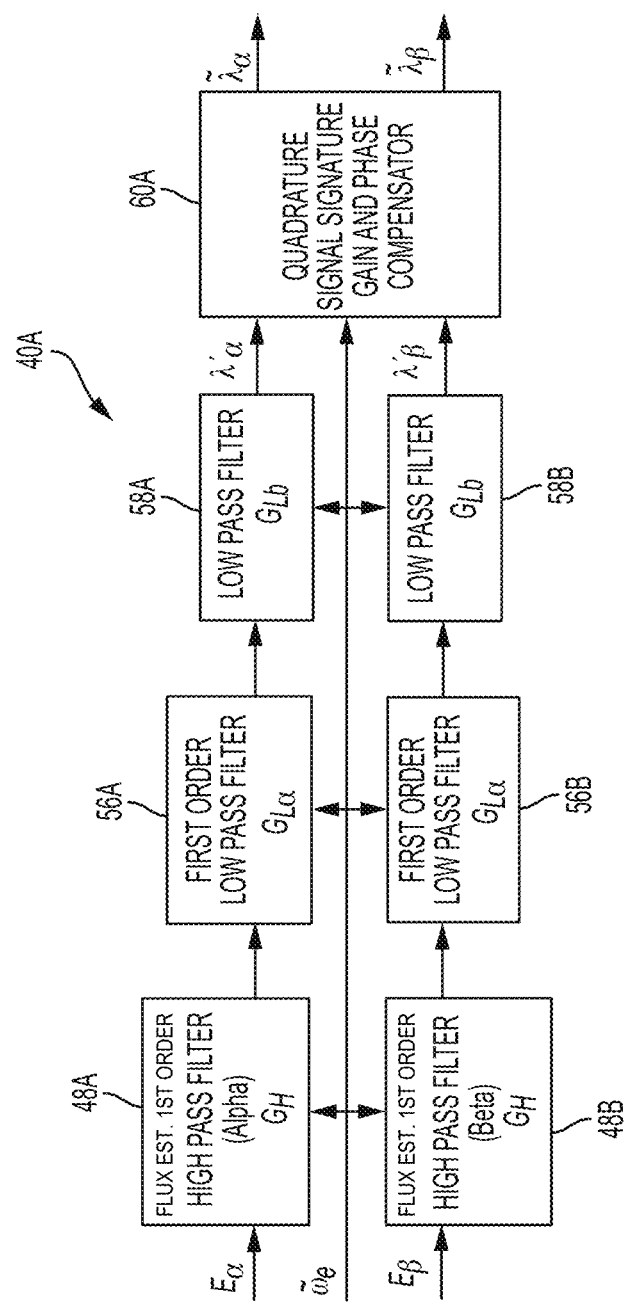
FIG. 5 is flow diagram illustrating a flux estimation module in accordance with another embodiment.

FIG. 5 illustrates another embodiment of a flux estimation module. Here, the flux estimation module 40A includes a first set of cascaded first order programmable low pass filter modules 56A, 56B, and a second set of cascaded first order programmable low pass filter modules 58A, 58B, along with a flux estimation high pass filter module (alpha) 48A and a flux estimation high pass filter module (beta) 48B. Importantly, the configuration of the first set 56A, 56B and second set 58A, 58B of cascaded first order programmable low pass filter modules and the flux estimation high pass filter modules 48A, 48B can be reversed. In this case, the transfer functions of the flux estimation high pass filter module (alpha) 48A and the flux estimation high pass filter module (beta) 48B, which includes $G_H(s)$, and the two sets of cascaded first order programmable low pass filter modules, which include $G_{La}(s)$, $G_{Lb}(s)$, respectively, are as follows, $$G_H(s) = \frac{s}{s + k_H|\tilde{\omega}_e|}$$

$$G_{La}(s) = \frac{1}{s + k_{La}|\tilde{\omega}_e|}$$

$$G_{Lb}(s) = \frac{1}{s + k_{Lb}|\tilde{\omega}_e|}$$

The flux estimation high pass filter module (alpha) 48A and the flux estimation high pass filter module (beta) 48B are configured to remove DC offset in the input and are programmable. The sets of first order programmable low pass filter modules are required to provide a $$\frac{\pi}{2}$$

phase lag of an integrator, and also to compensate the phase lead provided by the flux estimation high pass filter modules 48A, 48B. Accordingly, a cascaded first order programmable low pass filter module design (e.g. a sequential arrangement of low pass filters) is used in this embodiment.

The flux estimation module 40A of FIG. 4 also includes a quadrature signal signature compensator module 60A. If the filter modules are tuned such that the gain and phase of the composite structure is not substantially identical as that of an integrator, the quadrature signal signature compensator 60A module modulates the filtered output, to ensure the output of the flux estimation module 40A mimics characteristics of a pure integrator in steady-state. Thus, the configuration described in FIG. 5 can also be a decoupled cascaded structure, where both signal paths are decoupled, and also as a complimentary structure, where both signals are used to correct each other.

Figure 6:
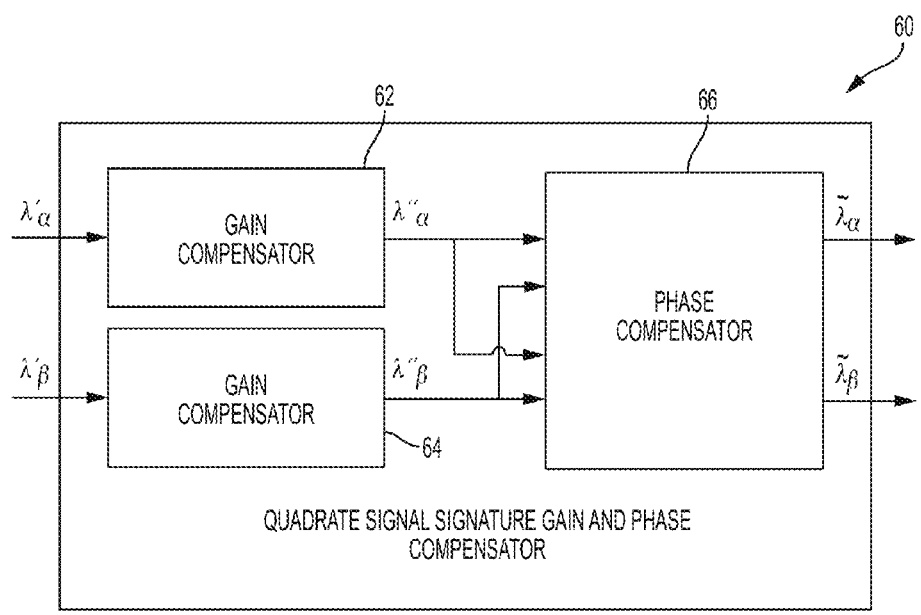
FIG. 6 is a flow diagram illustrating quadrature signal signature compensator module in accordance with some embodiments.

FIG. 6 illustrates the quadrature signal signature compensator module 60 in more detail. The quadrature signal signature compensator module 60 may perform the compensation according to the following equation, $$\tilde{\lambda}_{\alpha\beta} = \frac{E_{\alpha\beta}}{j\gamma|\omega_e|}$$

where $\gamma$ is the sign of motor velocity. As an example, for the case of a programmable high pass filter module and the doubly cascaded first order programmable low pass filter module as shown in FIG. 5, the aforementioned relationship produces the following correction equations, $$\lambda_\alpha = \lambda_\alpha'|\tilde{\omega}_e|(k_H + k_{La} + k_{Lb} - k_H k_{La} k_{Lb}) - \gamma|\tilde{\omega}_e|\lambda_\beta'(1 - k_H k_{La} - k_H k_{Lb} - k_{La} k_{Lb})$$

$$\lambda_\beta = \lambda_\beta'|\tilde{\omega}_e|(k_H + k_{La} + k_{Lb} - k_H k_{La} k_{Lb}) + \gamma|\tilde{\omega}_e|\lambda_\beta'(1 - k_H k_{La} - k_H k_{Lb} - k_{La} k_{Lb})$$

The quadrature signal signature compensator module 60 of FIG. 6 is also applicable to the quadrature signal signature compensator module 60A shown in FIG. 5. As such, the gain compensation performed by gain compensators 62, 64 of the quadrature signal signature compensator module 60A may be performed by employing the following relationship, $$|\lambda_{\alpha\beta}''| = \frac{|E_{\alpha\beta}|}{|\tilde{\omega}_e|}$$

For the case of a programmable high pass filter module 54 and two first order programmable low pass filter modules 56, 58, as shown in FIG. 5, the relationship for the quadrature signal signature compensator module 60A produces the following gain correction equations, $$|\lambda_{\alpha\beta}''| = |\tilde{\omega}_e|(\sqrt{1 + k_H^2}\sqrt{1 + k_{La}^2}\sqrt{1 + k_{Lb}^2})|\lambda_{\alpha\beta}'|$$

Thereafter, the phase compensation from to $\lambda_{\alpha\beta}''$ to $\tilde{\lambda}_{\alpha\beta}$ may be obtained, using the following relationship.

$$\tilde{\lambda}_{\alpha\beta} = \frac{E_{\alpha\beta}}{j\gamma}$$

The flux estimation modules 40, 40A of FIG. 4 and FIG. 5 respectively use motor velocity as a factor for performance.

Figure 7:
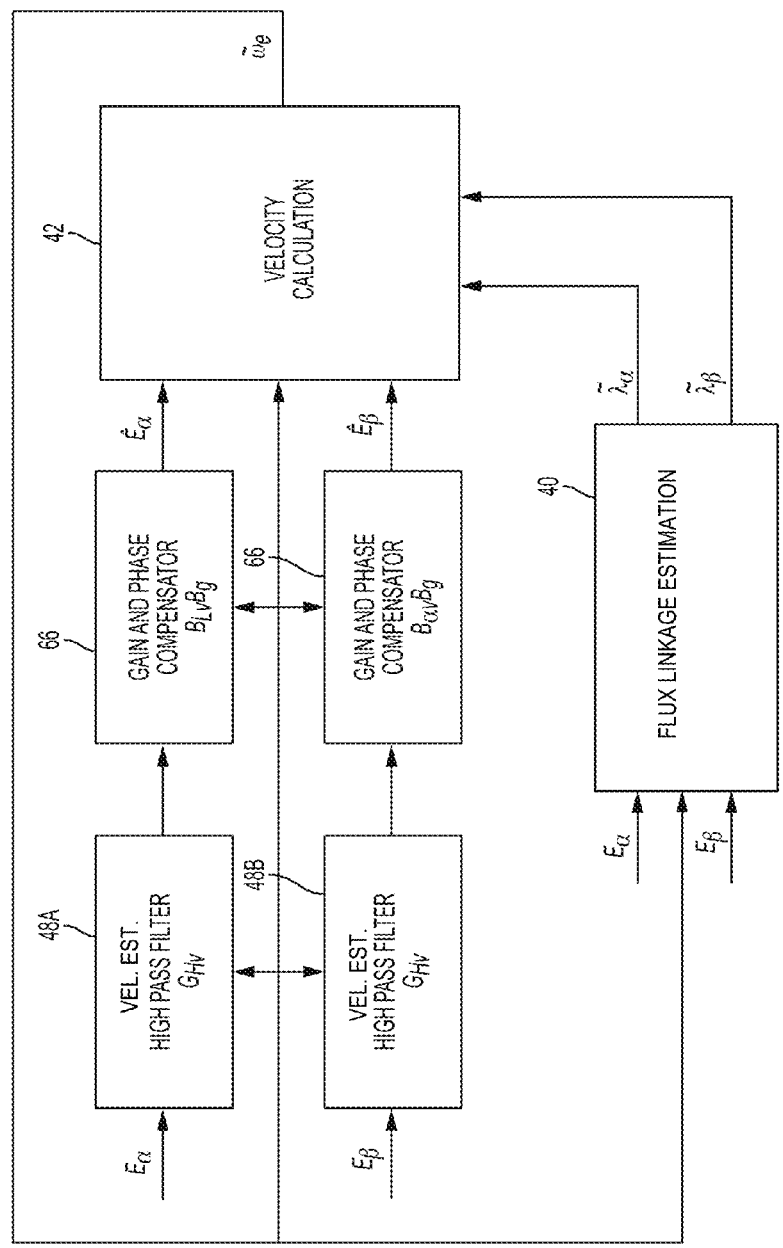
FIG. 7 is a flow diagram illustrating a velocity estimation module in accordance with some embodiments.

The velocity estimation module 42 is illustrated in more detail in FIG. 7. The velocity estimation module 42 estimates a motor velocity based on the motor currents, the motor voltages and the flux linkage estimates. The structure of the velocity estimation module 42 is a derivative-based design and may employ the following equation, $$\tilde{\omega}_e = \frac{\lambda_\alpha \dot{\lambda}_\beta - \lambda_\beta \dot{\lambda}_\alpha}{\lambda_\alpha^2 + \lambda_\beta^2} = \frac{\lambda_\alpha E_\beta - \lambda_\beta E_\alpha}{\lambda_\alpha^2 + \lambda_\beta^2}$$

From the above equation that the offset errors in measurements will cause errors in the velocity estimate. A filtering scheme including a programmable high pass filter and a gain and phase compensator that utilizes the estimated velocity in a recursive manner is incorporated to remove the DC offset in the measured signals. Specifically, the BEMF inputs are filtered and then used to calculate the velocity.

Note that it is possible to use different filter designs for pre-filtering the BEMF signals, as long as the correct input-output relationship is maintained. For a general filter structure, the gain and phase relationships between the inputs and outputs that must be ensured are mentioned below.

$$E_{\alpha\beta}(j\omega_e) = \hat{E}_{\alpha\beta}(j\omega_e)$$

As an example, the filter transfer functions $B_H(s)$, $B_L(s)$ may be chosen as follows, $$B_H(s) = \frac{s}{s + k_{Hv}|\tilde{\omega}_e|}$$

$$B_L(s) = \frac{k_{Lv}|\tilde{\omega}_e|}{s + k_{Lv}|\tilde{\omega}_e|}$$

Since the filter combination is required to remove the DC input and simultaneously retain the original phase of the input, the relationship between the cutoff frequency scalars is obtained as follows, $$\angle B_H(j\omega_e) - \angle B_L(j\omega_e) = 0$$

$$\tan^{-1}(k_{Hv}) - \tan^{-1}\left(\frac{1}{k_{Lv}}\right) = 0$$

$$k_{Lv} = \frac{1}{k_{Hv}}$$

Further, the gain compensator $B_g(s)$ is chosen so that the original signal amplitude remains intact is, as shown below, $$B_g = 1 + k_{Hv}^2$$

Since motor speed is fundamentally a low bandwidth signal, it is preferable to filter the estimate with a fixed cutoff low pass filter to filter out high frequency estimation noise. It is also possible to perform the velocity estimation in a low sampling rate control loop to improve software throughput. For the down-sampling process from the flux estimator to the velocity estimator, a properly tuned anti-aliasing filter should be used.

A digital implementation of the estimation module may facilitate high performance applications because difference in the magnitude and phase between the designed continuous-time filters and their discrete-time equivalents may cause significant errors in the estimated quantities. Since the frequency of interest for various programmable filters proposed above is the synchronous frequency $\omega_e$, the bilinear transform with prewarping with estimated synchronous frequency $\tilde{\omega}_e$ as the critical frequency may be used for the discretization process. In other words, since the response of the programmable filters are required to be exactly correct at the synchronous frequency only, this discretization method ensures that the frequency distortion in the digital implementation is minimal. This is a different (and unique) implementation of the digital system, as the discretization process is partially "online" since the critical frequency is estimated online. The equation for the s to z domain transformation for the proposed discretization is shown as follows, $$s = \frac{\tilde{\omega}_e}{\tan\left(\frac{\tilde{\omega}_e T_s}{2}\right)} \frac{1 - z^{-1}}{1 + z^{-1}}$$

For all the other fixed cutoff frequency filters, the direct bilinear transformation may be utilized for the digital implementation. A closed-loop position estimator may be used with the flux linkage and velocity estimators described above for estimating the rotor position.

The closed loop observer uses feedback of the estimated position and corrects the synchronous reference frame by regulating the error between the measured currents and estimated currents in the estimated reference frame (using estimated position) to zero. As mentioned earlier, in the process of computing the estimated position, the estimator also produces a velocity estimate.

The flux estimates are used along with the estimated position to compute the reference currents.

$$\tilde{I}_{\alpha 1} = \frac{\tilde{\lambda}_\alpha + \lambda_m \cos\tilde{\theta}}{L_s}$$

$$\tilde{I}_{\beta 1} = \frac{\tilde{\lambda}_\beta + \lambda_m \sin\tilde{\theta}}{L_s}$$

Next, the current errors are computed using the reference and measured currents.

$$\Delta I_{\alpha\beta} = \tilde{I}_{\alpha\beta 1} - \tilde{I}_\alpha$$

The current errors are used along with the estimated position to perform a reference frame transformation.

$$\Delta I_d = \Delta I_\alpha \cos\tilde{\theta} + \Delta I_\beta \sin\tilde{\theta}$$

$$\Delta I_q = \Delta I_\alpha \sin\tilde{\theta} - \Delta I_\beta \cos\tilde{\theta}$$

One of the currents errors, i.e., either d or q, is chosen, and a regulator (following example shows a simple PI regulator, but it should be understood that other regulators may be used) is employed to produce the velocity signal as an estimate.

$$\tilde{\omega}_e = \left(K_P + \frac{K_I}{s}\right)\Delta I_{dq}$$

The velocity is then integrated to produce the position estimate as follows.

$$\hat{\theta} = \frac{\hat{\omega}_e}{s}$$

The updated position is used to compute the current errors which are thereafter used to calculate the flux errors as follows.

$$\tilde{I}_{\alpha 2} = \frac{\tilde{\lambda}_\alpha + \lambda_m \cos \hat{\theta}}{L_s}$$

$$\tilde{I}_{\beta 2} = \frac{\tilde{\lambda}_\beta + \lambda_m \sin \hat{\theta}}{L_s}$$

$$\Delta I_{\alpha\beta 2} = I_{\alpha\beta 2} - \tilde{I}_\alpha$$

$$\Delta \lambda_{\alpha\beta} = L_s \Delta I_{\alpha\beta 2}$$

The flux errors are then used to correct the flux estimates for use in the next loop. It should be noted that the flux corrections are only for position estimation, and is decoupled from the flux linkage and velocity observers proposed earlier. It is clear that this estimator is a Model Reference Adaptive Scheme (MRAS) type observer.

As used herein, the term "module" or "sub-module" refers to an application specific integrated circuit (ASIC), an electronic circuit, a processor (shared, dedicated, or group) and memory that executes one or more software or firmware programs, a combinational logic circuit, and/or other suitable components that provide the described functionality. When implemented in software, a module or a sub-module can be embodied in memory as a non-transitory machine-readable storage medium readable by a processing circuit and storing instructions for execution by the processing circuit for performing a method. Moreover, the modules and sub-modules shown in the Figures may be combined and/or further partitioned.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A system for estimating flux linkage in an electric motor, the system comprising:
    a flux estimation module that generates estimated flux linkages based on a back electromagnetic force and a first estimated motor velocity of the electric motor, the flux linkages having an alpha flux linkage component and a beta flux linkage component; and
    a velocity estimation module that generates a second estimated motor velocity based on the back electromagnetic force and the estimated flux linkages received from the flux estimation module.

2. The system of claim 1, wherein the flux estimation module includes:
    a flux estimation high pass filter module that filters the back electromagnetic force signal, thereby generating a high pass output;
    a flux estimation low pass filter module that filters the high pass output thereby generating a low pass output, the flux estimation low pass filter module is a second order filter, the flux estimation low pass filter module may include a plurality of first order filters; and
    a quadrature signal signature compensator module that generates the flux linkage based on the low pass output and the estimated motor velocity.

3. The system of claim 2, the flux estimation low pass filter module and the flux estimation high pass filter module are digitally implemented using a bilinear with prewarping that uses the estimated motor velocity as a critical frequency.

4. The system of claim 2, wherein the quadrature signal signature compensator module compensates based on a sign of the estimated motor velocity.

5. The system of claim 2, wherein the flux estimation high pass filter module and the flux estimation low pass filter module operate as functions of the estimated motor velocity.

6. The system of claim 1, wherein the velocity estimation module includes:
    a velocity estimation high pass filter module that filters the back electromagnetic force signal, thereby generating a high pass output; and
    a gain and phase compensator module that filters the high pass output thereby generating a low pass output, the gain and phase compensator module is a first order filter.

7. The system of claim 6, the gain and phase compensator module and the velocity estimation high pass filter module are digitally implemented using a bilinear with prewarping that uses the estimated motor velocity as a critical frequency.

8. The system of claim 1, wherein the flux estimation module includes:
    a flux estimation low pass filter module that filters the back electromagnetic force signal with a second order filter, thereby generating a low pass output;
    a flux estimation high pass filter module that filters the low pass output, thereby generating a high pass output; and
    a quadrature signal signature compensator module that generates the flux linkage based on the high pass output.

9. The system of claim 8, the flux estimation low pass filter module and the flux estimation high pass filter module are digitally implemented using a bilinear with prewarping that uses the estimated motor velocity as a critical frequency.

10. The system of claim 1, wherein the velocity estimation module includes:
    a gain and phase module that filters the back electromagnetic force signal thereby generating a low pass output, the gain and phase compensator module is a first order filter; and
    a velocity estimation high pass filter module that filters the low pass output, thereby generating a high pass output.

11. The system of claim 10, the gain and phase compensator module and the velocity estimation high pass filter module are digitally implemented using a bilinear with prewarping that uses the estimated motor velocity as a critical frequency.

12. A method for estimating flux linkage in an electric motor, the method comprising:
    generating estimated flux linkages based on a back electromagnetic force and a first estimated motor velocity of the electric motor, the flux linkages having an alpha flux linkage component and a beta flux linkage component; and generating a second estimated motor velocity based on the back electromagnetic force and the estimated flux linkages that were computed using the first estimated motor velocity.

13. The method of claim 12, wherein generation of the estimated flux linkages includes:
    filtering the back electromagnetic force signal, thereby generating a high pass output;
    filtering the high pass output thereby generating a low pass output, the filtering is performed with a second order filter that includes a plurality of first order filters; and
    generating the flux linkage based on the low pass output and the estimated motor velocity.

14. The method of claim 13, wherein the generating the flux linkage based on the low pass output includes compensating based on a sign of the estimated motor velocity.

15. The method of claim 13, wherein the filtering is based on functions of the estimated motor velocity.

16. The method of claim 13, wherein the generating the second estimated motor velocity includes:
    filtering the back electromagnetic force signal, thereby generating a high pass output; and
    filtering the high pass output with a second order filter, thereby generating a low pass output.

17. The method of claim 16, the filtering is digitally implemented using a bilinear method with prewarping that uses the estimated motor velocity as a critical frequency.

18. The method of claim 13, wherein the generating the estimated flux linkages includes:
    filtering the back electromagnetic force signal with a second order filter, thereby generating a low pass output;
    filtering the low pass output, thereby generating a high pass output; and
    a quadrature signal signature compensator module that generates the flux linkage based on the high pass output.

19. The method of claim 18, the filtering is digitally implemented using a bilinear with prewarping that uses the estimated motor velocity as a critical frequency.

20. The method of claim 13, wherein the generating the second estimated motor velocity includes:
    filtering the back electromagnetic force signal with a first order filter, thereby generating a low pass output; and
    filtering the low pass output with a high pass filter, thereby generating a high pass output.

* * * * *